US005536177A

United States Patent [19]
Casey

[11] Patent Number: 5,536,177
[45] Date of Patent: Jul. 16, 1996

[54] SET OF CONNECTORS FOR STACKED CIRCUIT BOARD ARRAY

[75] Inventor: Daniel T. Casey, Harrisburg, Pa.

[73] Assignee: The Whitaker Corporation, Wilmington, Del.

[21] Appl. No.: 210,825

[22] Filed: Mar. 18, 1994

[51] Int. Cl.$^6$ .................................................. H01R 9/09
[52] U.S. Cl. ........................................ 439/74; 439/75
[58] Field of Search ............................... 439/68, 69, 74, 439/75, 540, 44, 45, 46, 50, 655, 650

[56] References Cited

U.S. PATENT DOCUMENTS

| | | | |
|---|---|---|---|
| 2,977,562 | 3/1961 | Benson | 439/75 X |
| 3,267,334 | 8/1966 | Wull | 439/69 X |
| 3,999,105 | 12/1976 | Archey et al. | 317/100 |
| 4,173,387 | 11/1979 | Zell | 439/655 X |
| 4,552,422 | 11/1985 | Bennett et al. | 439/75 X |
| 4,909,746 | 3/1990 | Scholz | 439/82 |
| 4,929,185 | 5/1990 | Wong et al. | 439/74 OR |
| 5,315,481 | 5/1994 | Smolley | 439/74 X |

Primary Examiner—P. Austin Bradley
Assistant Examiner—Daniel Wittels
Attorney, Agent, or Firm—Anton P. Ness

[57] ABSTRACT

An assembly (10) of circuit boards (12,14,16) stacked in a parallel array, having first connectors (40) about the periphery of first circuit boards (12,16) and second connectors (90) about the periphery of second circuit board (14) defining aligned connector stacks. Contacts (52) of the first connectors (40) include socket contact sections (56) along mating faces (48) and post sections (58) extending through board through-holes to ends matable with the socket contact sections of the connector adjacent thereto in the stack and are joined as desired to associated traces of the first circuit board through which they extend. Contacts (104) of second connectors (90) terminate within the connector housing and include post sections (106) extending similarly through second circuit board (14) to mate with contacts (52) of an adjacent first connector (40). Elongate fasteners (120) extend through mounting holes (30) of the circuit boards and through mounting holes (44,94) of the connectors, securing the assembly together to be manipulated as a unit.

13 Claims, 6 Drawing Sheets

SET OF CONNECTORS FOR STACKED CIRCUIT BOARD ARRAY

FIELD OF THE INVENTION

The present invention is directed to electrical connectors and more particularly to connectors for circuit boards.

BACKGROUND OF THE INVENTION

Electrical connectors are known that are mountable to circuit boards and that have arrays of electrical contacts having post sections adapted to be inserted into through-holes of the circuit boards to establish electrical connections with circuits thereof by firmly engaging or being soldered to plating material on walls of the through-holes. Accessories are also known, such as board locks, to affix such connectors to the circuit boards.

Stackable connectors are also generally known that, when mounted to respective circuit boards, provide electrical interconnections from board to board in a stacked assembly of circuit boards in a parallel array. An example of one such stackable connector is disclosed in U.S. Pat. No. 4,909,746, wherein post sections of contacts of a first connector extend through respective through-holes of a first circuit board to matingly engage with complementary socket contact sections of the contacts of the complementary connector mounted to a second circuit board, and so on, with each post section electrically connectable to a trace of the board through which it extends by being soldered to plating material in or peripherally around the through-hole.

SUMMARY OF THE INVENTION

The present invention provides electrical connectors and accessories for the assembly of a stacked array of two or more parallel circuit boards, not only providing all the electrical interconnections between the boards but also defining the mechanical connections to enable the assembly to be manipulated as a unit of convenient size for assembly within an apparatus. For convenience the assembly will be described as a vertical array having a bottommost circuit board and a topmost circuit board, both being endmost boards at the ends of the array. A plurality of first connectors are mounted to top surfaces of all circuit boards save the topmost board at connector sites that upon appropriate arrangement of the circuit boards into their positions within the assembly will be vertically aligned or stacked. The first connectors preferably are disposed to the outer edges or periphery of each board thus surrounding an interior region of the board's top surface containing a plurality of selected electrical and electronic components mounted thereto. A plurality of second connectors is mounted to the top surface of the topmost board about its periphery aligned with associated stacks of first connectors of the other boards upon final assembly, and each second connector defines preferably an imperforate board-remote surface rather than a mating face.

All first connectors possess a common length and width dimensions and extend a common selected height from the board-proximate faces thereof to an opposed mating face, with the arrays of contacts disposed in vertical passageways thereof. The contacts of each array extend from socket contact sections exposed along the connector mating face to post sections depending below the board-proximate faces to extend through respective through-holes of the associated board for mating with the socket contact sections of the connector therebeneath. The post sections of the contacts are solderable if desired to plating material within the respective through-holes or about their peripheries, or include compliant spring portions generating sufficient spring force to establish an assured electrical connection with plating material within the through-holes without solder, whenever it is desired to provide an electrical connection of the particular contact with a trace of the circuit board through which it extends.

Contacts of the first connectors mounted to the lowermost circuit board have shortened post sections for extending as little as possible from beneath the bottom surface thereof, if no electrical connection of the contacts is desired beyond the bottommost board. At selected contact locations of first connectors of intermediate circuit boards, such contacts with shortened post sections may be used, if it is desired to provide no electrical connection with the opposite contact of the next adjacent connector on the next adjacent circuit board. Contacts of the second connectors define full length post sections extending from T-shaped body sections with the dielectric housings of the second connectors preferably insert molded about the T-shaped body sections of their contacts.

Each first and second connector includes at each end a vertical mounting hole aligned with a corresponding mounting hole through the circuit board to which it is to be mounted. A pair of aligned mounting holes of circuit boards and first and second connectors is thus defined at each connector stack, enabling elongate bolts to be disposed therethrough about the periphery of the arrangement for securing the assembly together. The first connectors include board-engaging embossments along the board-proximate faces thereof for engaging the circuit board upon being mounted thereupon. The first connectors also include first annular embossments around each mounting hole extending upwardly a common height from the mating faces thereof defining uppermost surfaces adjacent to the bottom surface of the circuit board above. The first connectors also preferably include second annular embossments around each mounting hole extending downwardly from the board-proximate face, having smaller diameters than the first annular embossments to extend into and through the mounting holes of the circuit board to which the connector is mounted, defining a stress relief for the electrical connections during fabrication and manipulation of the assembly. Preferably the second annular embossments are incrementally longer than the nominal thickness of the circuit board and thus are engageable with the first annular embossments of the connector therebeneath, such that the connectors of each stack absorb the compression upon assembly of the bolts. Through the use of selectively plated connector mounting sections, a ground path may be defined at each fastener location upon connection of the fastener to external or chassis ground.

The connectors and accessories of the present invention thus provide a complete kit of parts for assembling a vertical stack of parallel circuit boards in an interconnected array. The present invention provides a mechanism for maintaining all the circuit boards of the assembly in parallel a common distance apart. The connectors form a physical protective barrier around the components of each of the circuit boards. In one particular embodiment of the present invention, for circular circuit boards, the connectors are arcuate to be mounted at connector sites adjacent the periphery of the boards; and the passageways are so formed to maintain the contacts therewithin in a radial or tangential orientation with respect to the circuit board.

An embodiment of the present invention will now be described by way of example, with reference to the accompanying drawings.

DETAILED DESCRIPTION OF THE PREFERRED EMBODIMENT

Figure 1:
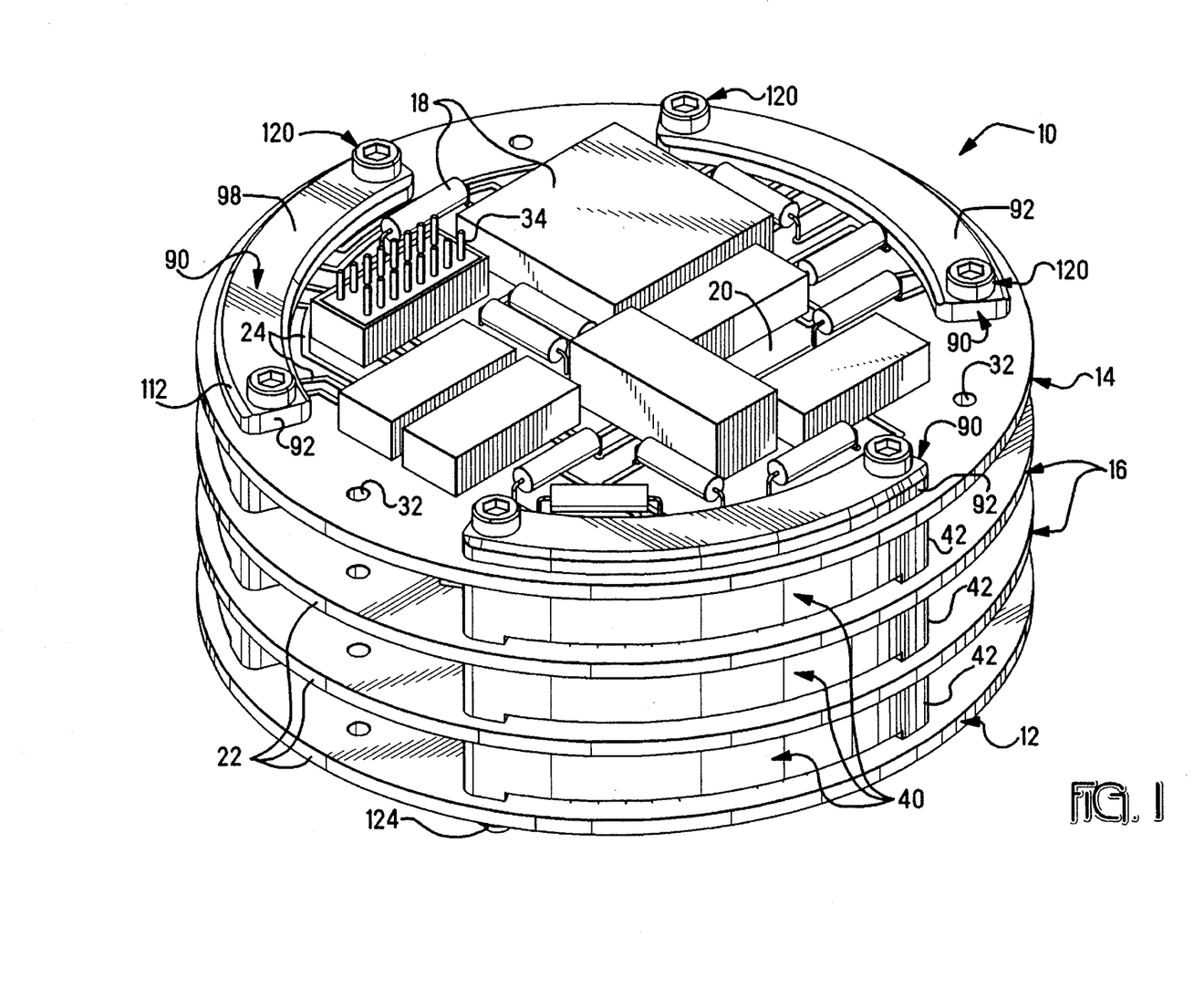
FIG. 1 is an isometric view of the complete assembly of connectors and parallel circuit boards in a stacked array.
Figure 2:
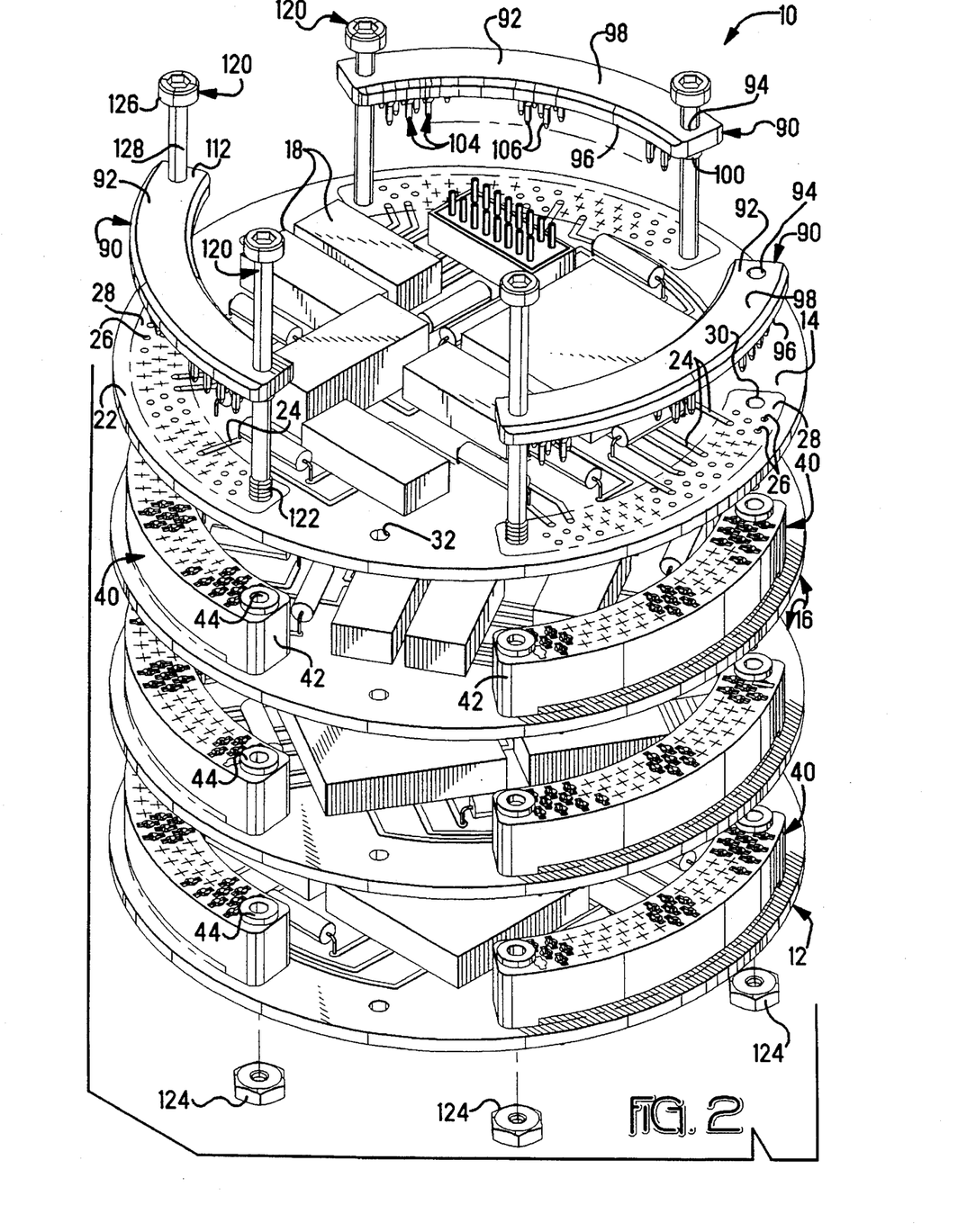
FIG. 2 is an exploded view of the circuit boards of FIG. 1 illustrating the connectors mounted thereon and the fastening accessories.

Assembly 10 of FIGS. 1 and 2 includes an end or bottommost most first circuit board 12 and a topmost board 14, and is shown to include two intermediate first boards 16. Each board includes an array of various electrical and electronic components 18 disposed in an interior region 20 thereof. First connectors 40 include dielectric housings 42 that are mounted to endmost and intermediate boards 12,16, and second connectors 90 include dielectric housings 92 that are mounted to topmost board 14, all adjacent the peripheral edges 22 of the respective boards to define connector stacks about the peripheries of the boards. The circuit boards are illustrated to be circular, and the first and second connectors are shown to be correspondingly arcuate for board real estate efficiency, all to define a generally cylindrical assembly 10 manipulatable as a unit to be mounted and enclosed within a cylindrical structure (not shown).

Circuit boards 12,14,16 each include a plurality of circuit traces 24 extending from leads of components 18 to respective plated through-holes 26 in arrays at connector sites 28 for ultimate electrical connection to contacts of the connectors. Also seen is an electrical connector 34 shown mounted in the interior region of circuit board 14, for example, providing for electrical input/output connection of assembly 10 to a control unit (not shown). At each end of each connector site 28 is a mounting hole 30 that will be aligned with mounting holes 44,94 of first and second connectors 40,90 through which will be inserted elongate bolts 120 having threaded ends 122 to which will be secured nuts 124 to mechanically secure together the circuit boards 12,14,16 to define assembly 10. Other mounting holes 32 may be provided enabling fastening of assembly 10 to framework of the apparatus into which it will be assembled. Each second connector 90 includes an imperforate upper surface 98 and a board-proximate face 96 shown to be mountable against the top surface of topmost circuit board 14, preferably with annular embossments 100 depending therefrom to abutment surfaces 102, surrounding mounting holes 94 and having an outer diameter smaller than an associated mounting hole 30 of topmost circuit board 14 to extend through mounting hole 30. Second contacts 104 are seen to include elongate post sections 106 depending from board-proximate face 96 to be inserted into and through corresponding through-holes 26 of second circuit board 14.

Figure 3:
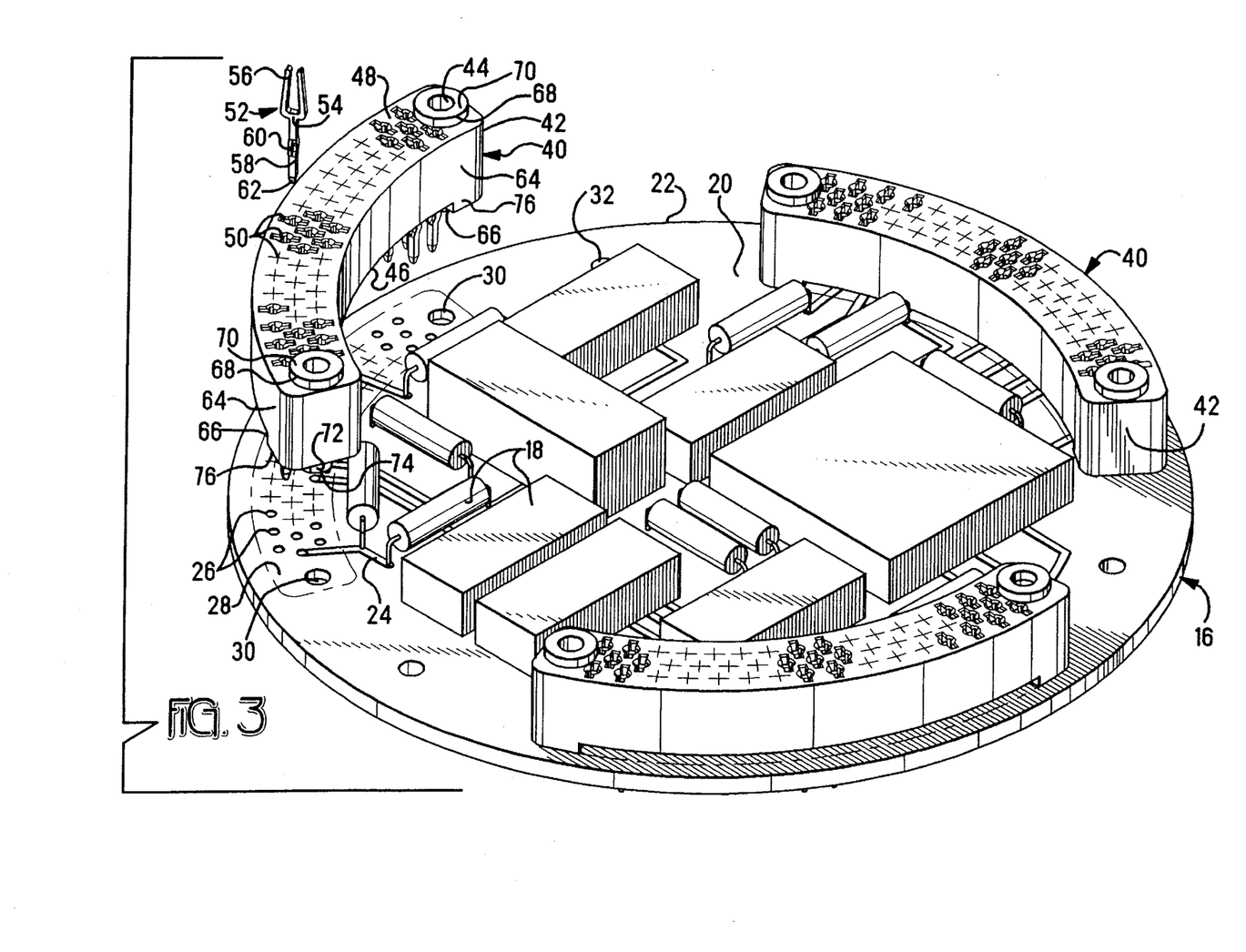
FIG. 3 is an isometric view of a circuit board of FIGS. 1 and 2 with a first connector exploded therefrom and illustrating a representative contact exploded from the connector.

In FIG. 3, a first connector 40 is shown to have a housing 42 of dielectric material, extending from a board-proximate face 46 to an opposed mating face 48, and including an array of passageways 50 for respective first contacts 52. Each first contact 52 is elongate having a body section 54 extending from a socket contact section 56 to an elongate post section 58, with post section 58 including for example a compliant spring portion 60 to be disposed within a plated through-hole of a circuit board, and a free end 62 received into a socket contact section of another contact for mated electrical engagement therewith. The socket contact section may be of the tuning fork type as shown, or may be of the box type as is disclosed in U.S. Pat. No. 4,909,746. Each passageway 50 includes an entrance having lead-in surfaces facilitating the insertion of a first contact 52 during assembly of connector 40, and also facilitating receipt thereinto of an end of a mating contact's post section to be appropriately aligned with socket contact section 56 of first contact 52 for becoming mated therewith.

Each first connector 40 includes mounting sections 64 at each end through which extend mounting holes 44, with embossments 66 along board-proximate face 46 beneath mounting sections 64 defining standoffs to provide a limited clearance between the board and the board-proximate surface around the contact array. Standoffs 66 also provide an accurate predetermined depth to the insertion of free end 62 of post section 58 into the socket contact section of the mating contact of the adjacent connector in the connector stack. First annular embossments 68 extend upwardly from mating face 48 around each mounting hole 44 to an abutment surface 70, and second annular embossments 72 depend from board-proximate face 46 to abutment surfaces 74, surrounding each mounting hole 44 having an outer diameter smaller than an associated mounting hole 30 of the circuit board, to extend through mounting hole 30 similarly to annular embossments 100 of second connectors 90, best seen in FIGS. 4 and 7.

Figure 4:
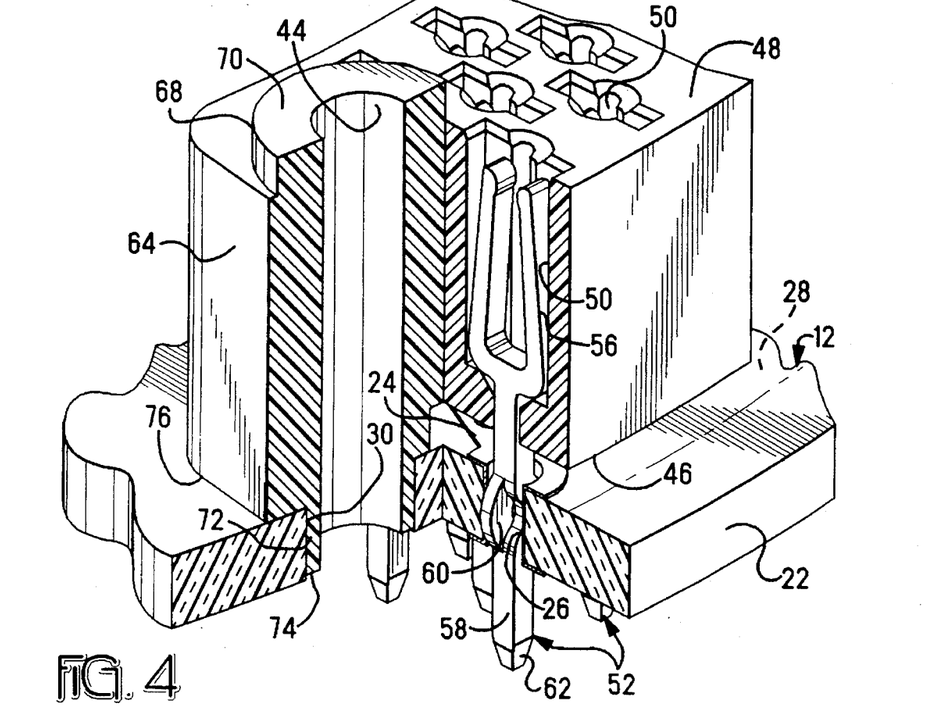
FIGS. 4 and 5 are enlarged cross-section views of first and second connectors respectively mounted to associated circuit boards, each showing a connector mounting section and a contact thereof.

Referring now to FIG. 4, a first connector 40 is seen to have its second annular embossment extend into a corresponding mounting hole 30 of circuit board 12. A first contact 52 is also shown to include post section 58 extending through and beyond plated through-hole 26 of board 12, to free end 62. Within through-hole 26, compliant spring section 60 provides a compressive fit upon insertion with the plating material along the side walls of the through-hole, that is conductively connected to a corresponding trace 24 as shown if it is desired to provide a connection to a trace of board 12. However, it may be desired to not provide such an electrical connection, easily enabled by providing no trace extending to the through-hole, where it is desired to define an electrical connection between only non-adjacent boards. Soldering may be optionally used to enhance the assurance of a satisfactory electrical connection of the compliant spring portion with the plating material, but is usually not necessary with several styles of compliant spring portions such as is disclosed in U.S. Pat. No. 4,186,982. Body section 54 is disposed in passageway 50 of housing 42, and socket contact section 56 is shown disposed within passageway 50 and exposed at the passageway entrance and slightly recessed thereinto along mating face to receive thereinto and mate with a post section of another contact when the next adjacent board is stacked thereabove during assembly of assembly 10.

Figure 5:
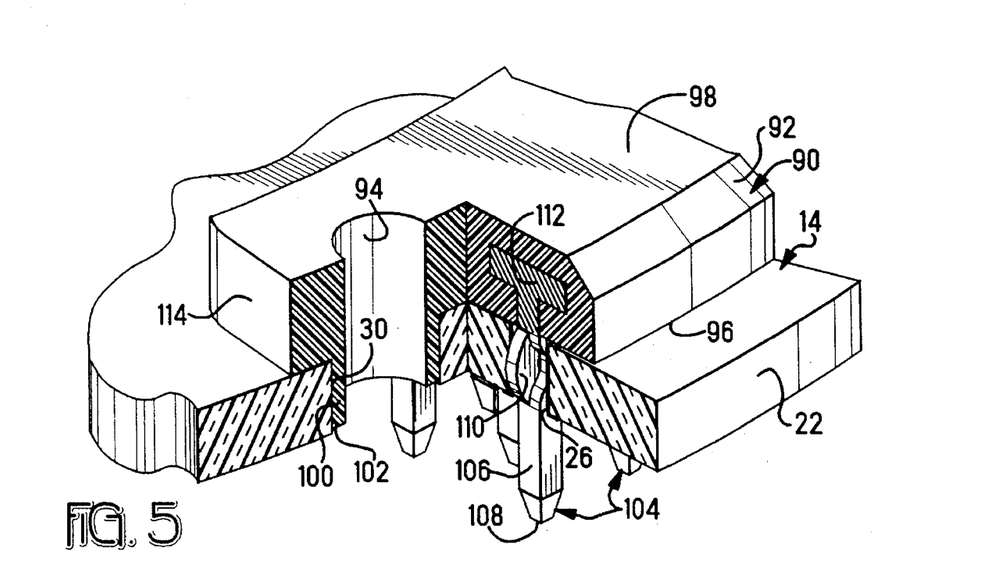

In FIG. 5 is shown a second connector 90. Second contact 104 is seen to include a post section 106 extending beneath board-proximate face 96 of housing 92 to free end 108, extending through and beyond second circuit board 14 for mating, and having a compliant spring portion 110 establishing electrical connection with a board trace conductively joined to plating material of through-hole 26 if desired. Body section 112 is embedded in housing 92, having a T-shape as shown; different shapes to body sections 112 may be used that also serve to anchor the contact within the housing. Housing 92 is preferably thermoplastic resin that is molded over the body sections of the array of second contacts 104 in an insert molding process that is generally conventionally known, thus providing the imperforate board-remote surface 98, since board 14 is an endmost board to which no further electrical connections with the contacts will be made at a mating face. Annular embossment 100 is shown disposed in mounting hole 30 of second circuit board 14, at mounting section 114.

Figure 6:
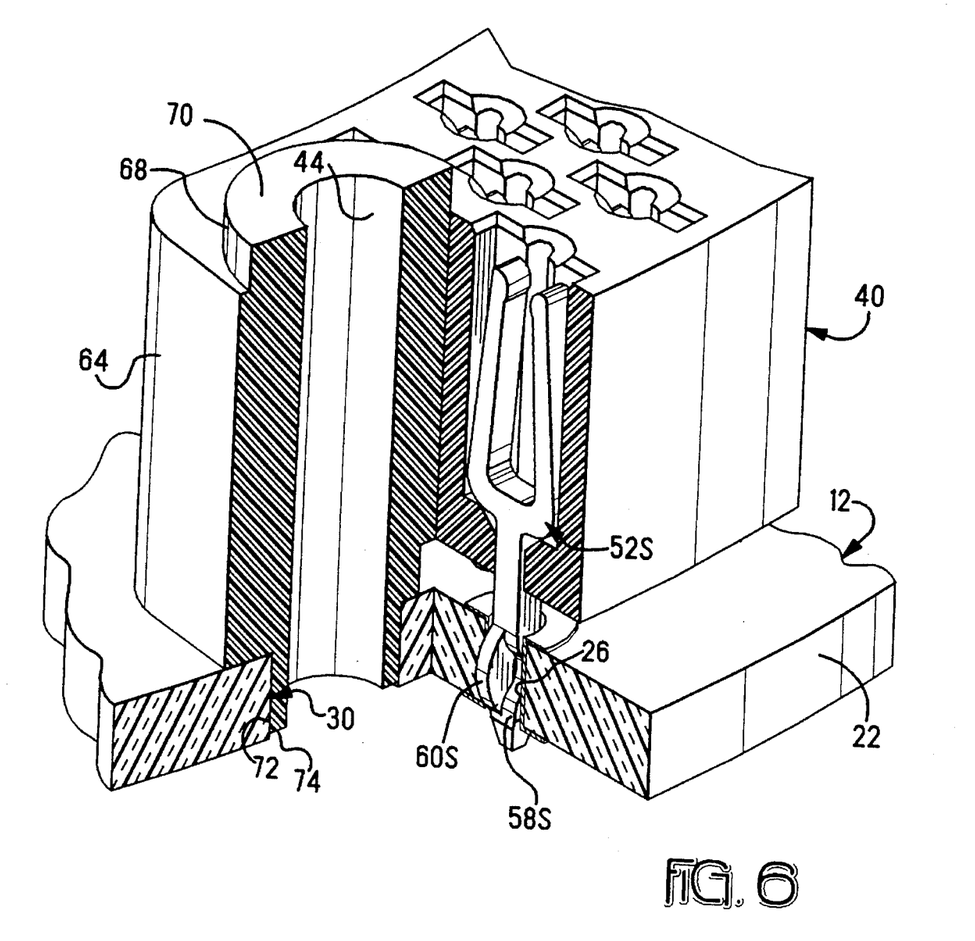
FIG. 6 is an enlarged cross-section view of a first connector showing a short contact disposed therein.

Referring now to FIG. 6, a first connector 40 is shown mounted to endmost first circuit board 12 and having contacts 52S, similar to contacts 52 of connector 40 of FIG. 4 but foreshortened. Regarding endmost first circuit board 12, no further mating is generally desired of the contacts of first connectors 40 with those of an adjacent connector therebeneath. Post sections 58S need extend no further than compliant spring portion 60S which establishes an electrical connection with the plating material of through-hole 26 of board 12. Optionally potting material may be adhered to the bottom surface of endmost circuit board 12 at least around the contact arrays, upon mounting of all connectors 40 and following performance of all soldering operations to insulate the exposed metal to preserve the integrity of the circuits from incidental engagement with another conductive article.

However, elongate post sections such as of contacts 52 may be used to extend from the bottom surface of endmost circuit board 12 enabling further electrical connection to individual conductors, for example, by conventional wire wrapping. Conversely, foreshortened contacts 52S may be utilized to disrupt certain contact stacks between the intermediate circuit boards, for example, where it is desired to provide connections between only topmost board 14 and the adjacent intermediate board 16, and between only endmost first circuit board 12 and the adjacent intermediate board 16.

Figure 7:
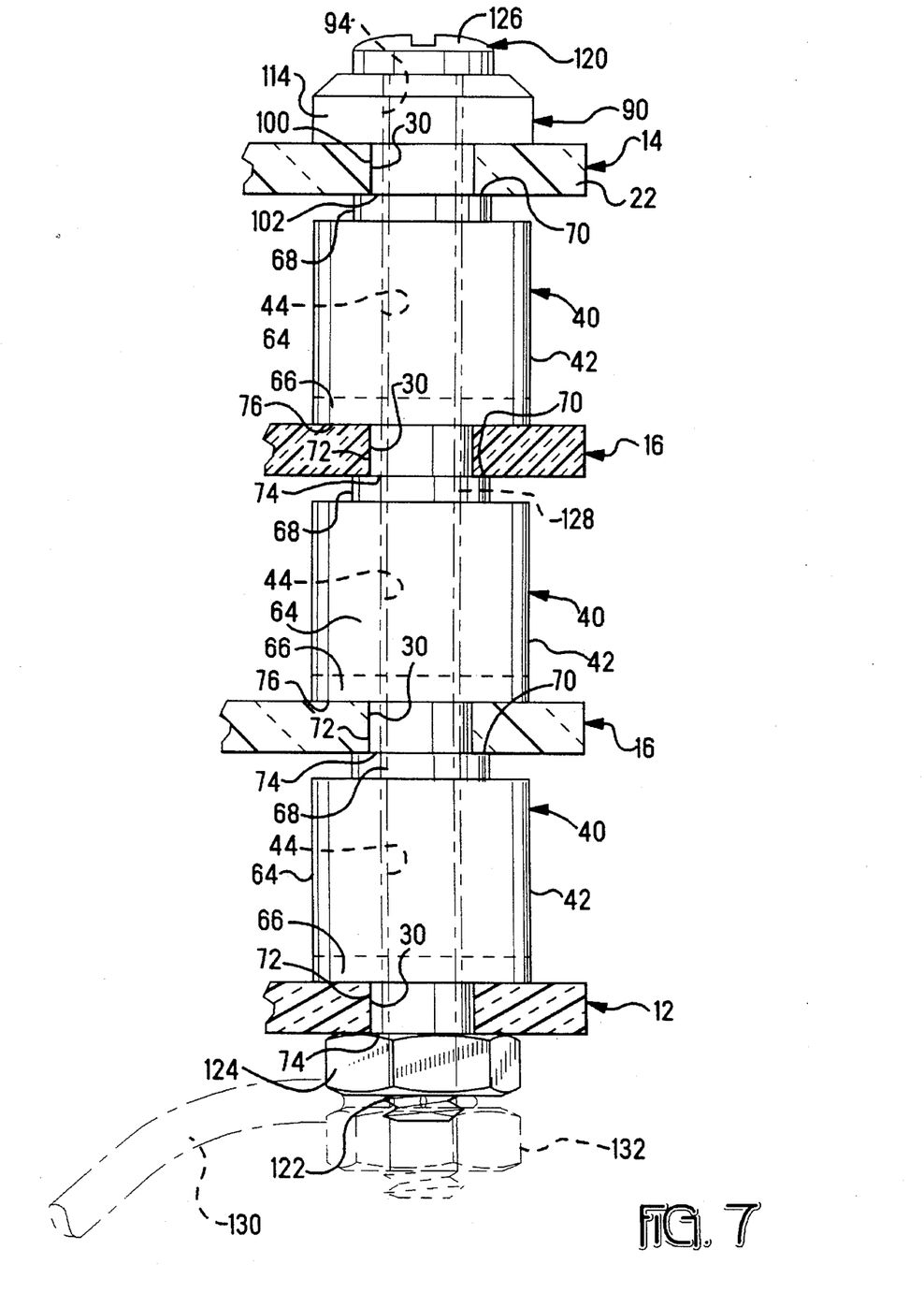
FIG. 7 is a cross-section view of the stacked circuit board array illustrating the connector mounting sections and a fastener extending therethrough.

FIG. 7 illustrates assembly 10 at a bolt location, with a bolt 120 extending from topmost board 14 to threaded end 122 and nut 124 beneath bottommost board 12. Each bolt includes a head 126 adapted for tool engagement, and shank 128 is seen extending therefrom through mounting holes 94,44 of mounting sections 64 of housings 92,42 and through the smaller diameter annular embossments 100,72 disposed within mounting holes 30 of circuit boards 14,16, 12.

Preferably in the inventive arrangement embodied in assembly 10, the circuit boards 12,14,16 are relieved of the forces of compression by the array of fasteners, by providing annular embossments 100 and second annular embossments 72 with lengths no less than the nominal thicknesses of the circuit boards, such as 0.093 inches or 0.125 inches, assuring that abutment surfaces 102,74 abut corresponding abutment surfaces 70 of first annular embossments 68.

Optionally, it may be desired to utilize the fastening arrangements as a ground path, such as by providing a slightly extended threaded bolt end as a ground stud, with a ground wire 130 electrically connected thereto using an additional nut 132, as shown in phantom, and providing conductive surfaces of mounting sections 64,114 of connectors 40,90. Providing such conductive surfaces is easily accomplished by conventional plating of metal to the plastic housing surfaces selectively at abutment surfaces 76 of standoffs 66 engageable with ground circuits of the circuit boards, at board-proximate surface 96 of second connector 90 around mounting holes 94, and at abutment surfaces 70,74,102 of the annular embossments to continue the ground from connector to connector in each connector stack, and also of topmost surface 98 of second connectors 90 such that a ground path commons all the connectors at mounting sections to the usually conductive fasteners and to the ground wires 130 for connection to chassis ground.

Connectors 40,90 of the present invention are shown to have an arcuate shape complementing the periphery of the circular circuit boards, thus optimizing the use of the limited real estate of the circuit boards that in the embodiment shown are intended to be result in a multi-board stacked assembly disposed within a cylindrical structure (not shown).

It is seen that the present invention provides a compact assembly of electrical and electronic components interconnected by circuits, providing a means for including such an arrangement within a small space of an apparatus otherwise generally requiring a single large circuit board of prohibitive size, and more easily programmable through selection of contacts of the connectors to interconnect selected circuits, facilitating the fabrication of circuit boards through simplification of the necessary trace pattern interconnecting the components.

Variations and modifications may be made to the embodiment of the present invention disclosed hereby, that are within the spirit of the invention and the scope of the claims.

What is claimed is:

1. A kit of parts for assembling together and electrically interconnecting a plurality of first circuit boards and a second circuit board in a parallel array along a stacking axis to be manipulated as a unit, comprising:

a plurality of first electrical connectors associated with each said first circuit board and a like plurality of second electrical connectors associated with said second circuit board, and a plurality of fasteners;

each said first connector including a first housing of dielectric material having a board-proximate face and an opposed board-remote face, and an array of passageways extending between said board-proximate and board-remote faces, and a first electrical contact secured within each said passageway and being of the type including a socket contact section exposed for mating along said board-remote face and a post section extending beyond said board-proximate face sufficiently to at least extend through a plated through-hole of an associated said first circuit board for electrical engagement with a corresponding trace thereof;

each said second connector including a second housing of dielectric material having a board-proximate face and an opposed board-remote face, and an array of second contacts secured at first ends thereof secured within said second housing and including elongate post sections extending beyond said board-proximate face to extend through corresponding plated through-holes of said second circuit board for electrical engagement with corresponding traces thereof and extending beyond said second circuit board to respective free ends for mating;

said first contacts of said first connectors mounted on intermediate ones of said first circuit boards including elongate said post sections extending beyond an associated said intermediate board to electrically engage a said socket contact section of a said first connector adjacent thereto in said connector stack, all defining upon full assembly, interconnected electrical contact stacks from said second connectors to said first connectors mounted on an endmost one of said first circuit boards positioned at an end of said stacked array opposed to said second circuit board;

said first and second connectors being mountable to respective said first and second circuit boards at connector sites similarly located on each said board such that upon orienting said first and second circuit boards in parallel said first and second connectors are aligned with others thereof to define connector stacks extending along said stacking axis, and each of said first and second electrical connectors including mounting holes extending therethrough proximate each end from a board-remote surface to an opposed board-proximate surface thereof; and said plurality of elongate fasteners being insertable through aligned mounting holes of all said first and second circuit boards and said mounting holes of said first and second connectors mounted at aligned connector sites of said first and second circuit boards when said first and second circuit boards are appropriately aligned and oriented along said stacking axis with said first and second connectors aligned in said connector stacks, with said elongate fasteners assemblable securely thereto to define an assembly manipulatable as a unit.

2. The kit of parts as set forth in claim 1 wherein said post sections of selected ones of said first contacts of a selected said first connector are short, thereby enabling a desired disruption in the electrical circuit at a contact location in said array, between a circuit board to which said selected first connector is mounted and an adjacent connector in said connector stack.

3. The kit of parts as set forth in claim 1 wherein each said first connector includes first embossments extending from said board-remote face thereof a selected distance to coplanar abutment surfaces parallel to said board-remote face, and including standoffs extending from said board-proximate face thereof a selected distance to coplanar board-engaging surfaces parallel to said board-proximate face thereof.

4. The kit of parts as set forth in claim 3 wherein each said first and second connector includes annular embossments depending from said board-proximate face about respective said mounting holes, and said annular embossments having respective diameters slightly smaller than diameters of said mounting holes of said first and second circuit boards enabling said annular embossments to be inserted thereinto.

5. The kit of parts as set forth in claim 4 wherein each said annular embossment has a length no less than the nominal thickness of a said circuit board to which a said connector is mounted, whereby an endmost surface of said annular embossment abuts an abutment surface of an opposed said first embossment of an adjacent said first connector.

6. The kit of parts as set forth in claim 5 wherein at least all said endmost surfaces of said annular embossments and all said abutment surfaces of said first embossments are conductive, whereby ground paths are defined along each connector stack for connection to a chassis ground.

7. A stacked assembly of electrically interconnected circuit boards, comprising:

a plurality of first circuit boards and a second circuit board in a parallel array along a stacking axis, all of similar size and shape;

a plurality of first electrical connectors associated with each said first circuit board and a like plurality of second electrical connectors associated with said second circuit board, and a plurality of fasteners;

each said first connector including a first housing of dielectric material having a board-proximate face and an opposed board-remote face, and an array of passageways extending between said board-proximate and board-remote faces, and a first electrical contact secured within each said passageway and being of the type including a socket contact section disposed along said board-remote face and a post section extending beyond said board-proximate face at least extending through a plated through-hole of an associated said first circuit board for electrical engagement with a corresponding trace thereof;

each said second connector including a second housing of dielectric material having a board-proximate face and an opposed board-remote face, and an array of second contacts secured at first ends thereof secured within said second housing and including elongate post sections extending beyond said board-proximate face and through corresponding plated through-holes of said second circuit board for electrical engagement with corresponding traces thereof and extending beyond said second circuit board to respective free ends mated with associated ones of said socket contact sections of an adjacent said first connector;

said first contacts of said first connectors mounted on intermediate ones of said first circuit boards including elongate said post sections extending beyond an associated said intermediate board to electrically engage a said socket contact section of a said first connector adjacent thereto in said connector stack, all defining interconnected electrical contact stacks from said second connectors to said first connectors mounted on an endmost one of said first circuit boards positioned at an end of said stacked array opposed to said second circuit board;

said first and second connectors being mounted to respective said first and second circuit boards at connector sites similarly located on each said board such that said first and second connectors are aligned with others thereof to define connector stacks extending along said stacking axis, and each of said first and second electrical connectors including mounting holes extending therethrough proximate each end from a board-remote surface to an opposed board-proximate surface thereof; and said plurality of elongate fasteners extending through aligned mounting holes of all said first and second circuit boards and said mounting holes of said first and second connectors mounted at aligned connector sites of said first and second circuit boards, and fastening together all said circuit boards, whereby said first and second circuit boards are secured together and electrically interconnected, all to define an assembly manipulatable as a unit.

8. The assembly as set forth in claim 7 wherein said post sections of selected ones of said first contacts of a selected said first connector are short, thereby enabling a desired disruption in the electrical circuit at the contact location in the array, between a circuit board to which said selected first connector is mounted and an adjacent connector in said connector stack.

9. The assembly as set forth in claim 7 wherein each said first connector includes first embossments extending from said board-remote face thereof a selected distance to coplanar abutment surfaces parallel to said board-remote face and at least adjacent bottom surfaces of an adjacent one of said first and second circuit boards, and including standoffs extending from said board-proximate face thereof a selected distance to coplanar board-engaging surfaces parallel to said board-proximate face thereof and abutting a said circuit board to which said first connector is mounted.

10. The assembly as set forth in claim 9 wherein each said first and second connector includes annular embossments depending from said board-proximate face about respective said mounting holes, and said annular embossments having respective diameters slightly smaller than diameters of said mounting holes of said first and second circuit boards, whereby said annular embossments are disposed within respective said mounting holes of a said circuit board upon which said connector is mounted.

11. The assembly as set forth in claim 10 wherein each said annular embossment has a length no less than the nominal thickness of a said circuit board to which a said connector is mounted, whereby an endmost surface of said annular embossment abuts an abutment surface of an opposed said first embossment of an adjacent said first connector.

12. The assembly as set forth in claim 11 wherein at least all said endmost surfaces of said annular embossments and all said abutment surfaces of said first embossments are conductive, whereby ground paths are defined along mounting sections of each connector stack for connection to a chassis ground.

13. An assembly of an electrical connector to a circuit board, comprising:

a circuit board having at least one arcuate edge portion and an array of through-holes located at a connector site adjacent said arcuate edge portion, and further including circuit traces extending to respective ones of said through-holes of said array; and an electrical connector having an array of contacts including post sections depending from a board-proximate face thereof insertable into respective said through-holes of said circuit board, said electrical connector having an arcuate shape in a board-parallel plane corresponding to said arcuate edge portion of said circuit board, whereby the connector is mountable to the circuit board at the connector site adjacent the arcuate edge and optimally utilizing the area of the circuit board adjacent the arcuate edge portion.

* * * * *